United States Patent
Nagasaka

(10) Patent No.: US 7,916,270 B2
(45) Date of Patent: Mar. 29, 2011

(54) EXPOSURE APPARATUS, EXPOSURE METHOD, AND DEVICE MANUFACTURING METHOD

(75) Inventor: Hiroyuki Nagasaka, Kumagaya (JP)

(73) Assignee: Nikon Corporation, Tokyo (JP)

(*) Notice: Subject to any disclaimer, the term of this patent is extended or adjusted under 35 U.S.C. 154(b) by 333 days.

(21) Appl. No.: 11/712,916

(22) Filed: Mar. 2, 2007

(65) Prior Publication Data

US 2007/0242244 A1    Oct. 18, 2007

(30) Foreign Application Priority Data

Mar. 3, 2006    (JP) .................. 2006-057786

(51) Int. Cl.
G03B 27/42    (2006.01)
G03B 27/44    (2006.01)
G03B 27/54    (2006.01)
G03B 27/58    (2006.01)

(52) U.S. Cl. ............... 355/46; 355/53; 355/67; 355/72

(58) Field of Classification Search ............ 355/46, 355/53, 54, 67, 72; 250/492.2
See application file for complete search history.

(56) References Cited

U.S. PATENT DOCUMENTS

| | | | |
|---|---|---|---|
| 4,653,903 A * | 3/1987 | Torigoe et al. ........... 355/53 |
| 6,208,407 B1 | 3/2001 | Loopstra | |
| 6,238,852 B1 * | 5/2001 | Klosner ............ 430/396 |
| 6,400,441 B1 * | 6/2002 | Nishi et al. .......... 355/53 |
| 6,608,681 B2 | 8/2003 | Tanaka et al. | |
| 6,611,316 B2 * | 8/2003 | Sewell ................ 355/46 |
| 6,778,257 B2 | 8/2004 | Bleeker et al. | |
| 6,819,405 B2 | 11/2004 | Mulkens et al. | |
| 6,897,963 B1 | 5/2005 | Taniguchi et al. | |
| 2002/0123012 A1 | 9/2002 | Sewell | |
| 2003/0218730 A1 | 11/2003 | Murakami et al. | |
| 2004/0041104 A1 * | 3/2004 | Liebregts et al. ...... 250/492.22 |
| 2005/0213070 A1 | 9/2005 | Scharnweber | |
| 2005/0248856 A1 | 11/2005 | Omura et al. | |
| 2007/0013890 A1 | 1/2007 | Loopstra et al. | |

FOREIGN PATENT DOCUMENTS

JP    A-61-161718    7/1986

(Continued)

OTHER PUBLICATIONS

International Search Report issued in International Application No. PCT/JP2007/054028 mailed on May 29, 2007 (w/English Translation).

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus includes a projection optical system that has a first object field area and a second object field area different from the first object field area and that projects an image of a pattern onto a first image field and a second image field. The image of the pattern is formed in the first image field by exposure light via the first object field area, and the image of the pattern is formed in the second image field by exposure light via the second object field area. A first substrate is exposed with the image of the pattern formed in the first image field, and a second substrate is exposed with the image of the pattern formed in the second image field.

22 Claims, 10 Drawing Sheets

| | FOREIGN PATENT DOCUMENTS | |
|---|---|---|
| JP | A-06-120108 | 4/1994 |
| JP | A-07-161603 | 6/1995 |
| JP | A-08-313842 | 11/1996 |
| JP | A-11-135400 | 5/1999 |
| JP | A-2000-21742 | 1/2000 |
| JP | A-2000-164504 | 6/2000 |
| JP | A-2000-323404 | 11/2000 |
| JP | A-2001-513267 | 8/2001 |
| JP | A-2001-291654 | 10/2001 |
| JP | A-2001-297976 | 10/2001 |
| JP | A-2004-519850 | 7/2004 |
| JP | A-2004-304135 | 10/2004 |
| JP | A-2005-268781 | 9/2005 |
| WO | WO 99/23692 A1 | 5/1999 |
| WO | WO 99/27569 A1 | 6/1999 |
| WO | WO 99/49504 A1 | 9/1999 |
| WO | WO 02/069049 A2 | 9/2002 |
| WO | WO 2004/019128 A2 | 3/2004 |
| WO | WO 2005/059617 A2 | 6/2005 |
| WO | WO 2005/059618 A2 | 6/2005 |

OTHER PUBLICATIONS

Written Opinion of the International Searching Authority issued in International Application No. PCT/JP2007/054028 mailed on May 29, 2007 (w/English Translation).

* cited by examiner

EXPOSURE APPARATUS, EXPOSURE METHOD, AND DEVICE MANUFACTURING METHOD

CROSS-REFERENCE TO RELATED APPLICATION

Priority is claimed on Japanese Patent Application No. 2006-057786 filed Mar. 3, 2006, the content of which is incorporated herein by reference.

BACKGROUND OF THE INVENTION

1. Field of the Invention

The present invention relates to an exposure apparatus that exposes a substrate, and a device manufacturing method.

2. Background Art

In an exposure apparatus used in a photolithography process, which is one of the manufacturing processes of microdevices such as semiconductor devices and liquid crystal display devices, an exposure apparatus that exposes a photosensitive substrate with a pattern image of a mask is used. Japanese Unexamined Patent Application, First Publication No. S61-161718 discloses a technique related to an exposure apparatus which uses a plurality of masks to process a plurality of substrates in parallel.

Incidentally, it is demanded for the exposure apparatus to process the substrate with high throughput. When improvement of the throughput is aimed for by processing respective substrates in parallel by using a plurality of masks, the plurality of masks need to be prepared, which may invite a cost increase due to preparation of the plurality of masks, and hence, an increase in the manufacturing cost of the microdevices.

A purpose of some aspects of the invention is to provide an exposure apparatus and a device manufacturing method, which can improve the throughput while suppressing cost.

SUMMARY OF THE INVENTION

According to a first aspect of the present invention, in an exposure apparatus that exposes a substrate, there is provided an exposure apparatus comprising: a projection optical system that has a first object field area (a first field of view area) and a second object field area (a second field of view area) different from the first object field area and that projects an image of a pattern onto a first image field and a second image field, an image of the pattern being formed in the first image field by exposure light via the first object field area, and an image of the pattern being formed in the second image field by exposure light via the second object field area, wherein a first substrate is exposed with the image of the pattern formed in the first image field, and a second substrate is exposed with the image of the pattern formed in the second image field.

According to the first aspect of the present invention, the throughput can be improved, while suppressing cost, and the substrate can be efficiently exposed.

According a second aspect of the present invention, a device manufacturing method using the exposure apparatus in the first aspect is provided.

According to the second aspect of the present invention, devices can be manufactured by using an exposure apparatus that can expose the substrate efficiently.

DETAILED DESCRIPTION OF THE INVENTION

Hereunder is a description of embodiments of the present invention, with reference to the drawings. However the present invention is not limited to this description. In the following description, an XYZ rectangular coordinate system is established, and the positional relationship of respective members is described with reference to this XYZ rectangular coordinate system. A predetermined direction within a horizontal plane is made the X axis direction, a direction orthogonal to the X axis direction in the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX, the θY, and the θZ directions respectively.

First Embodiment

Figure 1:
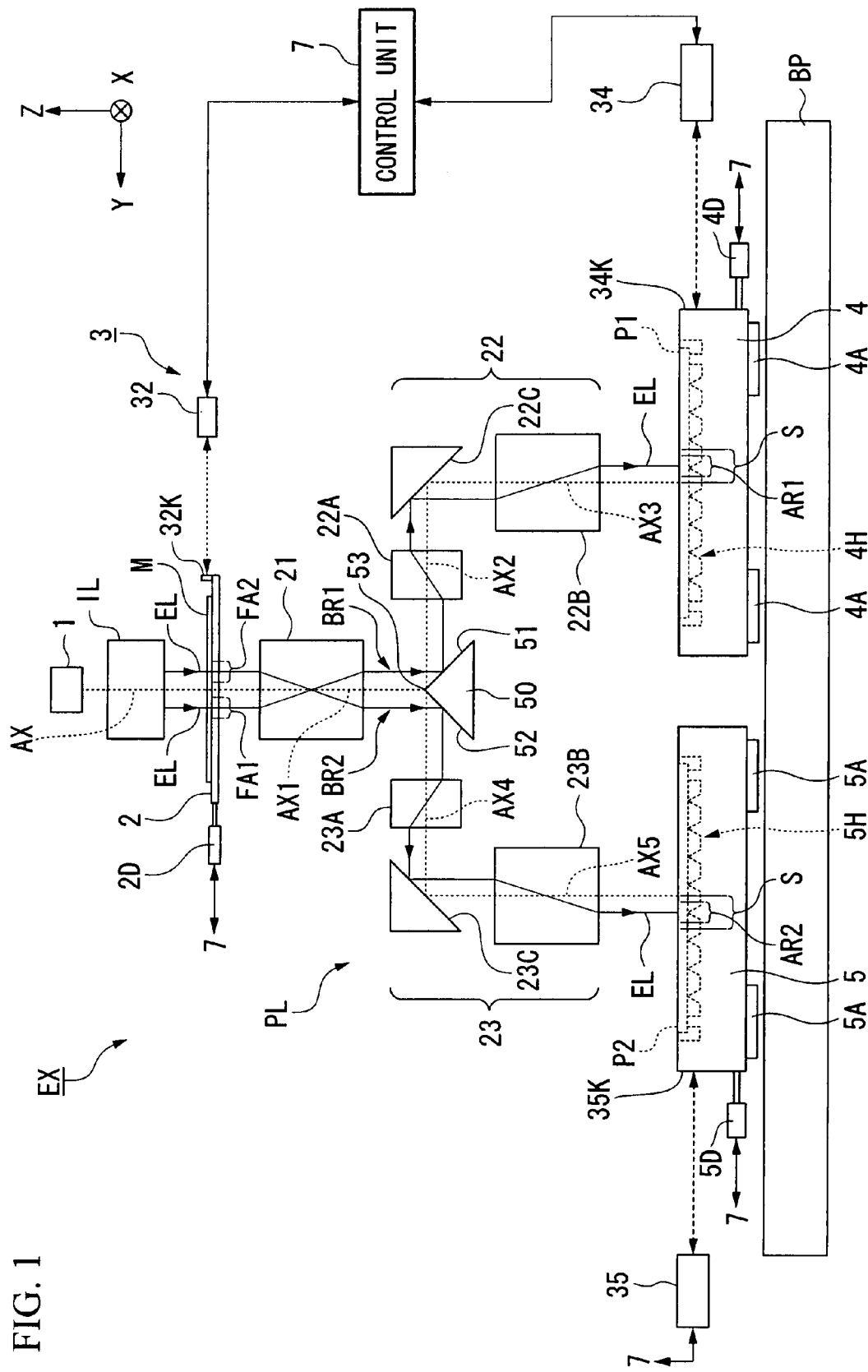
FIG. 1 is a schematic block diagram showing an exposure apparatus according to a first embodiment.

A first embodiment will be described. FIG. 1 is a schematic block diagram showing an exposure apparatus EX according to the first embodiment. In FIG. 1, the exposure apparatus EX includes; a mask stage 2 capable of holding and moving a mask M having a pattern PA, a first substrate stage 4 capable of holding and moving a first substrate P1, a second substrate stage 5 capable of holding and moving a second substrate P2 different from the first substrate P1, a measurement system 3 capable of measuring position information of the respective stages, a first illumination system IL that illuminates the pattern PA of the mask M with a first exposure light EL1, a projection optical system PL that projects an image of the pattern PA illuminated by the exposure light EL onto the respective first substrate P1 and the second substrate P2, and a control unit 7 that controls the operation of the overall exposure apparatus EX. The first substrate stage 4 and the second substrate stage 5 are capable of moving on a base member BP on a light emitting side of the projection optical system PL, that is, an image surface side of the projection optical system PL. The second substrate stage 5 is capable of moving independently of the first substrate stage 4.

Substrate here includes one in which a photosensitive material (photoresist) is coated on a substrate of for example a semiconductor wafer, such as a silicon wafer, and includes one on which various types of membrane such as a protective membrane (top coat membrane) other than a photosensitive membrane is coated. The mask includes a reticle on which is formed a device pattern to be projected in a reduced size onto the substrate, and is for example, one where a predetermined pattern is formed using a light shielding membrane such as chrome or the like on a transparent member of for example a glass plate. The transmission type mask is not limited to a binary mask on which the pattern is formed by a light shielding membrane, and includes, for example, a half tone type or a phase shift mask such as a spatial frequency modulation type. Furthermore, in the present embodiment, a transmission type mask is used for the mask, however a reflection type mask can be used.

The projection optical system PL of the present embodiment has a first object field area FA1 (a first field of view area) and a second object field area FA2 (a second field of view area) different from the first object field area FA1. In the present embodiment, the first object field area FA1 and the second object field area FA2 are separated in the Y axis direction. The projection optical system PL in the present embodiment sets a first image field AR1 and a second image field AR2 in a predetermined positional relationship on the light emitting side of the projection optical system PL, that is, the image surface side of the projection optical system PL. The projection optical system PL forms an image of the pattern PA in the first image field AR1 based on the exposure light EL from the pattern PA of the mask M positioned within the first object field area FA1, and also forms an image of the pattern PA in the second image field AR2 based on the exposure light EL from the pattern PA of the mask M positioned within the second object field area FA2.

The exposure apparatus EX of the present embodiment exposes a shot field S on the first substrate P1 held on the first substrate stage 4, with the image of the pattern PA formed in the first image field AR1, and exposes the shot field S on the second substrate P2 held by the second substrate stage 5, with the image of the pattern PA formed in the second image field AR2, respectively by the projection optical system PL. Specifically, the exposure apparatus EX illuminates the pattern PA of the mask M positioned in the first object field area FA1 with the exposure light EL emitted from the illumination system IL, and illuminates the pattern PA of the mask M positioned in the second object field area FA2 with the exposure light EL emitted from the illumination system IL. The image of the pattern PA is formed in the first image field AR1 formed on the first substrate P1 based on the exposure light EL from the pattern PA positioned in the first object field area FA1 of the projection optical system PL. The image of the pattern PA is formed in the second image field AR2 formed on the second substrate P2 based on the exposure light EL from the pattern PA positioned in the second object field area FA2 of the projection optical system PL. The exposure apparatus EX exposes the first substrate P1 with the image of the pattern PA formed in the first image field area AR1 and exposes the second substrate P2 with the image of the pattern PA formed in the second image field AR2.

Furthermore, the exposure apparatus EX of the present embodiment is a scanning type exposure apparatus (a so-called scanning stepper) that projects the image of the pattern PA of the mask M onto the respective first substrate P1 and second substrate P2, while the mask M, the first substrate P1, and the second substrate P2 are simultaneously moved in a predetermined scanning direction. In the present embodiment, the scanning direction (the simultaneous movement direction) of the first substrate P1 and the second substrate P2 is the Y axis direction. Furthermore, in the present embodiment, in synchronous with the movement in the Y axis direction of the first substrate P1 and the second substrate P2, the mask M also moves in the Y axis direction. That is, in the present embodiment, the scanning direction (synchronous movement direction) of the mask M is the Y axis direction.

In the present embodiment, the exposure apparatus EX concurrently executes the exposure for the first substrate P1 and at least a part of the exposure for the second substrate P2. The exposure apparatus EX exposes the shot field S on the first substrate P1 with the image of the pattern PA formed in the first image field AR1, while the shot field S on the first substrate P1 is moved in the Y axis direction relative to the first image field AR1. The exposure apparatus EX further exposes the shot field S on the second substrate P2 with the image of the pattern PA formed in the second image field AR2, while the shot field S on the second substrate P2 is moved in the Y axis direction relative to the second image field AR2. The mask M also moves in the Y axis direction while the shot fields S on the respective first substrate P1 and second substrate P2 are exposed, and the pattern PA of the mask M moves in the Y axis direction relative to the first object field area FA1 and the second object field area FA2 of the projection optical system PL.

The illumination system IL will be described. The illumination system IL of the present embodiment divides the exposure light EL from one light source device 1 into two exposure lights EL, and irradiates the divided exposure lights EL respectively onto the first object field area FA1 and the second object field area FA2 of the projection optical system PL. As described above, the first object field area FA1 and the second object field area FA2 are separated in the Y axis direction. The illumination system IL irradiates the exposure lights EL onto the mutually separated first object field area FA1 and second object field area FA2.

The control unit 7 arranges the mask M held on the mask stage 2 in the first object field area FA1 and the second object field area FA2 of the projection optical system PL at the time of exposing the first substrate P1 and second substrate P2. Each of two predetermined areas arranged in the first object field area FA1 and the second object field area FA2, of pattern forming areas in which the pattern PA of the mask M is formed, is illuminated by the exposure light EL to be irradiated onto the respective first object field area FA1 and second object field area FA2 of the projection optical system PL by the illumination system IL. The mask M is held on the mask stage 2. The illumination system IL illuminates the two predetermined areas on the mask M arranged in the first object field area FA1 and the second object field area FA2 by the exposure light EL having a uniform illumination distribution.

Next is a description of the first mask stage 1. In FIG. 1, the mask stage 2 is moveable by drive of a mask stage drive device 2D which includes an actuator such as a linear motor, in directions of 6 degrees of freedom, that is, the X axis, the Y axis, the Z axis, the θX, the θY and the θZ directions in a condition with the first mask M held. The mask stage 2 holds the mask M so that a pattern forming surface formed with the pattern PA of the mask M is substantially parallel with an XY plane. Position information of the mask stage 2 (and in turn the mask M) is measured by a laser interferometer 32 of a measurement system 3. The laser interferometer 32 measures the position information of the mask stage 2 using a reflecting surface 32K, of a moving mirror provided on the mask stage 2. The control unit 7 drives the mask stage drive device 2D based on the measurement result of the laser interferometer 32, to perform position control of the mask M which is held by the mask stage 2.

Figure 2:
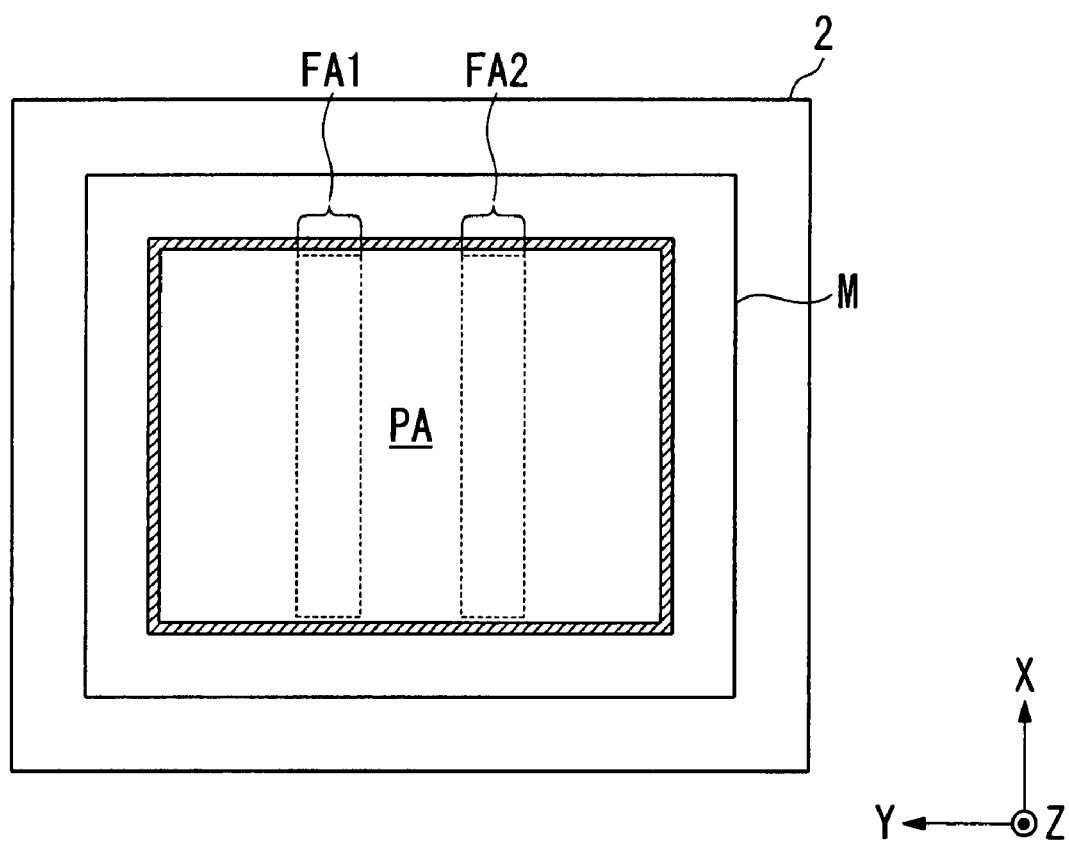
FIG. 2 shows a relationship between a mask and an object field area according to the first embodiment.

FIG. 2 is a plan view of the mask M held on the mask stage 2. As shown in FIG. 2, the mask stage 2 holds the mask M so that the pattern forming surface, on which the pattern PA of the mask M is formed, is substantially parallel to the XY plane. As shown in FIG. 2, the first object field area FA1 and the second object field area FA2 are separated in the Y axis direction. As described above, the illumination system IL irradiates the exposure light EL onto the first object field area FA1 and the second object field area FA2 of the projection optical system PL. The control unit 7 arranges the pattern forming area, in which the pattern PA of the mask M held on the mask stage 2 is formed, in the first object field area FA1 and the second object field area FA2. Accordingly, the exposure light from the illumination system IL can be irradiated onto each of the two predetermined areas in the pattern forming area. In the present embodiment, the respective first object field area FA1 and second object field area FA2 onto which the exposure light EL from the illumination system IL is irradiated, are set in a rectangular shape (slit shape), with the X axis direction being a longitudinal direction, by a first opening 15A and a second opening 15B of a blind device 15. That is, the first opening 15A and the second opening 15B have a rectangular shape having a longitudinal axis along the X axis direction.

The mask stage 2 is capable of moving the mask M having the pattern PA, in the Y axis direction relative to the first object field area FA1 and the second object field area FA2. The control unit 7 moves the mask M in the Y axis direction by controlling the mask stage 2 so that the pattern forming area, in which at least the pattern PA of the mask M is formed, passes through the respective first object field area FA1 and second object field area FA2 at the time of exposing the first substrate P1 and the second substrate P2.

Next is a description of the projection optical system PL, with reference to FIG. 1. The projection optical system PL forms (projects) an image of the pattern PA, based on the exposure light EL from the pattern PA positioned in the first object field area FA1, in the first image field AR1 at a predetermined magnification (projection magnification), and forms (projects) an image of the pattern PA, based on the exposure light EL from the pattern PA positioned in the second object field area FA2, in the second image field AR2 at a predetermined magnification (projection magnification). In the projection optical system PL of the present embodiment, the projection magnification is a reduction system of for example ¼, ⅕, or ⅛. The projection optical system PL can be any one of a reduction system, an equal magnification system, or an enlarging system. The plurality of optical elements of the projection optical system PL is held by a lens barrel (not shown in the drawing).

As shown in FIG. 1, the projection optical system PL of the present embodiment includes an optical member 50 having a first reflecting surface 51 arranged on a first optical path BR1, being an optical path of the exposure light EL from the first object field area FA1, and a second reflecting surface 52 arranged on a second optical path BR2, being an optical path of the exposure light EL from the second object field area FA2. The exposure light EL traveling on the first optical path BR1 from the first object field area FA1 is guided to the first image field AR1 via the first reflecting surface 51, and the exposure light EL traveling on the second optical path BR2 is guided to the second image field AR2 via the second reflecting surface 52.

Specifically, the projection optical system PL includes; a first optical element group 21 that guides the exposure light EL from the pattern PA to the first reflecting surface 51 and the second reflecting surface 52, a second optical element group 22 that guides the exposure light EL reflected by the first reflecting surface 51 to the first image field AR1, and a third optical element group 23 that guides the exposure light EL reflected by the second reflecting surface 52 to the second image field AR2. The exposure light EL from the pattern PA positioned in the first object field area FA1 is guided by the first optical element group 21 to enter onto the first reflecting surface 51, is reflected by the first reflecting surface 51, and is then guided by the second optical element group 22 to be irradiated into the first image field AR1. The image of the pattern PA positioned in the first object field area FA1 is formed in the first image field AR1. The exposure light EL from the pattern PA positioned in the second object field area FA1 is guided by the first optical element group 21 to enter onto the second reflecting surface 52, is reflected by the second reflecting surface 52, and is then guided by the third optical element group 23 to be irradiated into the second image field AR2. The image of the pattern PA positioned in the second object field area FA2 is formed in the second image field AR2.

In the present embodiment, the first optical element group 21 images the image of the pattern PA once. The second optical element group 22 includes a reflecting surface having a first portion group 22A into which the exposure light EL from the first reflecting surface 51 enters, a second portion group 22B including the optical element facing the first substrate P1, and a reflecting member having a reflecting surface 22C that reflects the exposure light EL via the first portion group 22A toward the second portion group 22B. The first portion group 22A and the second portion group 22B image the image of the pattern PA once, respectively. Therefore, the number of imagings by the optical system arranged between the first object field area FA1 and the first image field AR1 is three. The third optical element group 23 includes a reflecting member having a third portion group 23A into which the exposure light EL from the second reflecting surface 52 enters, a fourth portion group 23B including the optical element facing the second substrate P2, and a reflecting member having a reflecting surface 23C that reflects the exposure light EL via the third portion group 23A toward the fourth portion group 23B. The third portion group 23A and the fourth portion group 23B image the image of the pattern PA once, respectively. Therefore, the number of imagings by the optical system arranged between the second object field area FA2 and the second image field AR2 are three.

In the present embodiment, the optical member 50 includes a prism. The first reflecting surface 51 and the second reflecting surface 52 are arranged at a position optically conjugate with the first object field area FA1 and the second object field area FA2 or in the vicinity thereof. In the present embodiment, the first reflecting surface 51 and the second reflecting surface 52 are slopes inclining relative to the XY plane. A line segment (apex) 53 formed by the first reflecting surface 51 and the second reflecting surface 52 intersecting with each other is parallel to the X axis. A protrusion that protrudes so as to approach the first optical element group 21 is formed in the optical member 50 by the first reflecting surface 51 and the second reflecting surface 52. The cross-section parallel to the YZ plane of the protrusion of the optical member 50 is formed in a V-shape by the first reflecting surface 51 and the second reflecting surface 52.

As shown in FIG. 1, in the present embodiment, an optical axis AX1 of the first optical element group 21 is substantially parallel to the Z axis. An optical axis AX2 of the first portion group 22A in the second optical element group 22 and an optical axis AX4 of the third portion group 23A in the third optical element group 23 are substantially parallel to the Y axis, and are coaxial with each other. Therefore, the optical axes AX1, AX2, and AX4 intersect at one point. An optical axis AX3 of the second portion group 22B in the second optical element group 22 and an optical axis AX5 of the fourth portion group 23B in the third optical element group 23 are substantially parallel to each other. The optical member 50 is arranged so that an intersection point of the optical axes AX1, AX2, and AX4, and the line segment (apex) 53 coincide.

Next is a description of the first substrate stage 4. The first substrate stage 4 is supported without contact on the upper surface (guide surface) of a base member BP by an air bearing 4A, and is capable of holding and moving the first substrate P within a predetermined area including the first image field AR1, which is irradiated with the first exposure light EL1 to form the image of the pattern PA. The upper face of the base member BP is substantially parallel to the XY plane, and the first substrate stage 4 is capable of moving along the XY plane on the base member BP. The first substrate stage 4 includes a substrate holder 4H that holds the first substrate P1. The substrate holder 4H holds the first substrate P1 so that the surface of the first substrate P1 and the XY plane are substantially parallel to each other.

The exposure apparatus EX includes a first substrate stage drive device 4D including an actuator such as a linear motor for driving the first substrate stage 4. The first substrate stage 4 is moveable by drive of the first substrate stage drive device 4D, in directions of 6 degrees of freedom of the X axis, the Y axis, the Z axis, the θX, the θY and the θZ directions on the base member BP in a condition with the first substrate P1 held. The control unit 7, by controlling the first substrate stage drive device 4D, is capable of controlling the position of the surface of the first substrate P1 held on the substrate holder 4H of the first substrate stage 4, in relation to the directions of 6 degrees of freedom of the X axis, the Y axis, the Z axis, the θX, the θY and the θZ directions.

Next is a description of the second substrate stage 5. The second substrate stage 5 has substantially the same construction as the first substrate stage 4, and is supported without contact on the upper surface (guide surface) of the base member BP, by an air bearing 5A. The second substrate stage 5 is capable of holding and moving the second substrate P2 within a predetermined area including the second image field AR2 which is irradiated by the exposure light EL to form the image of the pattern PA. The second substrate stage 5 includes a substrate holder 5H that holds the second substrate P2. The substrate holder 5H holds the second substrate P2 so that the surface of the second substrate P2 and the XY plane are substantially parallel to each other.

The exposure apparatus EX includes a second substrate stage drive device 5D including an actuator such as a linear motor for driving the second substrate stage 5. The second substrate stage 5 is moveable by drive of the second substrate stage drive device 5D, in directions of 6 degrees of freedom of the X axis, the Y axis, the Z axis, the θX, the θY and the θZ directions on the base member BP in a condition with the second substrate P2 held. The control unit 7, by controlling the second substrate stage drive device 5D, is capable of controlling the position of the surface of the second substrate P2 held on the substrate holder 5H of the second substrate stage 5, in relation to the directions of 6 degrees of freedom of the X axis, the Y axis, the Z axis, the θX, the θY and the θZ directions.

The position information of the first substrate stage 4 (the first substrate P1) is measured by a laser interferometer 34 of a measurement system 3. The laser interferometer 34 uses a reflecting surface 34K provided on the first substrate stage 4, to measure the position information of the X axis, the Y axis, and the θZ directions of the first substrate stage 4. Moreover the surface position information (position information related to the Z axis, the θX and the θY directions) of the surface of the first substrate P1 held on the first substrate stage 4 is detected by a focus leveling detection system (not shown). The control unit 7 performs position control of the first substrate P1 held on the first substrate stage 4, by driving the first substrate stage drive device 4D based on the measurement result of the laser interferometer 34 and the detection result of the focus leveling detection system.

Likewise, the position information of the second substrate stage 5 (the second substrate P2) is measured by a laser interferometer 35 of the measurement system 3. The laser interferometer 35 uses a reflecting surface 35K provided on the second substrate stage 5, to measure the position information of the X axis, the Y axis, and the θZ directions of the second substrate stage 5. Moreover the surface position information (position information related to the Z axis, the θX and the θY directions) of the surface of the second substrate P2 held on the second substrate stage 5 is detected by the focus leveling detection system (not shown). The control unit 7 performs position control of the second substrate P2 held on the second substrate stage 5, by driving the second substrate stage drive device 5D based on the measurement result of the laser interferometer 35 and the detection result of the focus leveling detection system.

The focus leveling detection system detects the surface position information of the substrate by measuring the position information in the Z axis direction of the substrate, respectively, at a plurality of measurement points, as disclosed in for example U.S. Pat. No. 6,608,681. In the present embodiment, the plurality of measurement points is set such that at least a part thereof is positioned in the first and second exposure fields AR1 and AR2, however, all measurement points can be set outside of the first and second exposure fields AR1 and AR2.

The exposure apparatus EX can include a laser interferometer (Z interferometer) capable of measuring the position information in the Z axis direction of the first substrate stage 4 and the second substrate stage 5, for example, as disclosed in Japanese Unexamined Patent Application, First Publication No. 2000-323404, and Published Japanese translation No. 2001-513267 of PCT International Publication.

Figure 3:
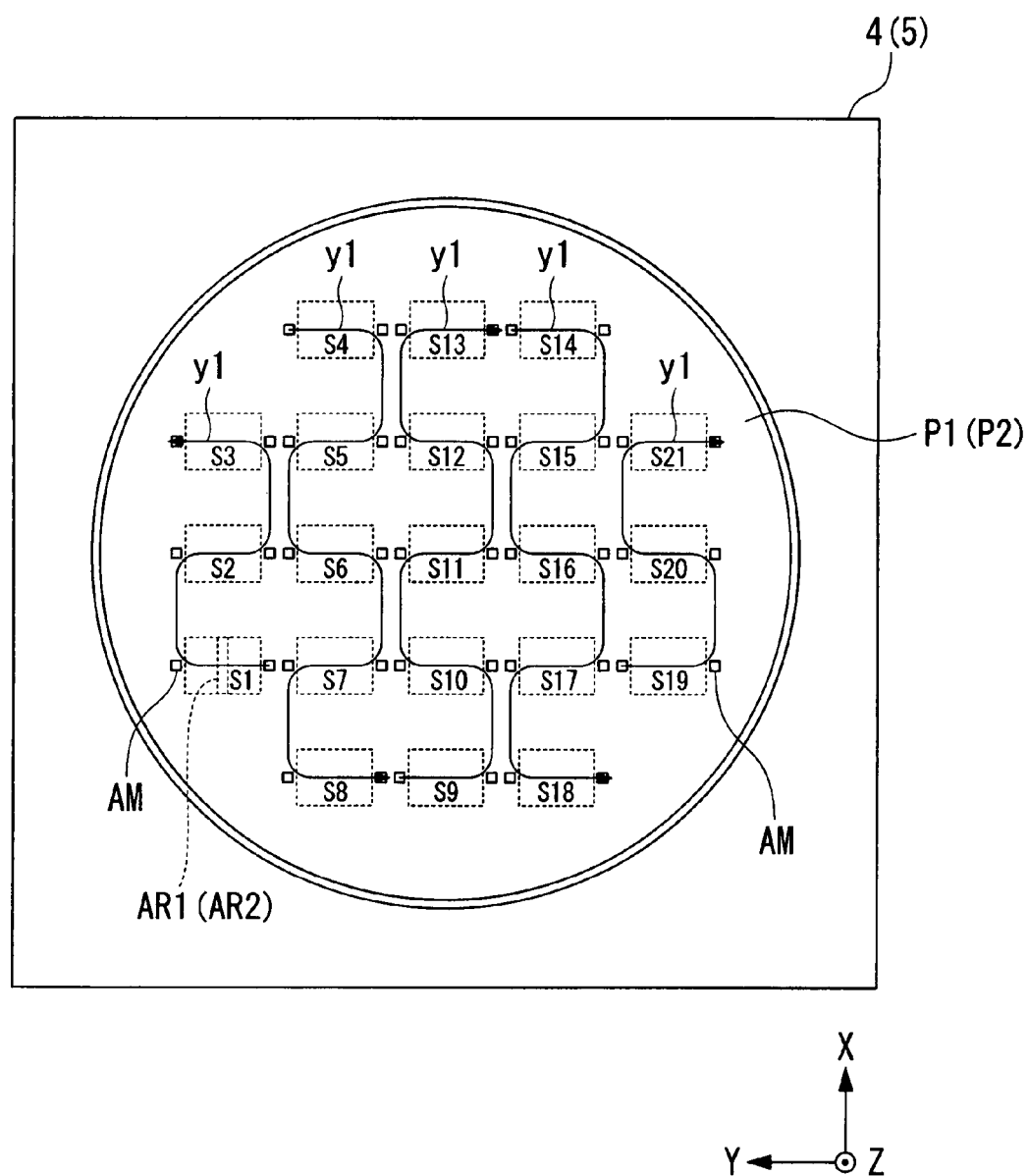
FIG. 3 shows a substrate stage as seen from above.

FIG. 3 is a plan view of the first substrate stage 4 holding the first substrate P1 as seen from above. As shown in FIG. 3, a plurality of shot fields S(S1 to S21) are set in a matrix on the first substrate P1, and a plurality of alignment marks AM is provided, respectively, so as to correspond to each of the shot fields S1 to S21. In the present embodiment, the alignment marks AM are formed on opposite sides in the Y axis direction of the shot field S, however, the number and position of the alignment marks AM is not limited thereto.

Moreover, as shown in FIG. 3, the first image field AR1 on the first substrate P1 is set in a rectangular shape (in a slit form) with the X axis direction being a longitudinal direction. The first image field AR1 to which the first exposure light EL is irradiated is a projection area of the projection optical system PL.

The first substrate stage 4 can move the shot field S on the first substrate P1 in the Y axis direction relative to the first image field AR1. At the time of exposing the first substrate P1, the control unit 7 controls the first substrate stage 4 so that the shot fields S (S1 to S21) on the first substrate P1 pass through the first image field AR1 corresponding to the first exposure light EL, moving the first substrate P1 in the Y axis direction.

At the time of exposing each shot field S1 to S21 on the first substrate P1, the control unit 7 irradiates the exposure light EL to the first image field AR1 to thereby irradiate the exposure light EL onto the first substrate P1, while relatively moving the first image field AR1 and the first substrate P1, for example, as shown by arrow y1 in FIG. 3. The control unit 7 controls the operation of the first substrate stage 4 so that the first image field AR1 moves along the arrow y1 relative to the first substrate P1. By repeating a scan operation in a −Y direction and a scan operation in a +Y direction of the first substrate P1, the control unit 7 sequentially exposes the plurality of shot fields S1 to S21 on the first substrate P1.

The first substrate stage 4 and the first substrate P1 on the first substrate stage 4 have been described above with reference to FIG. 3. The second substrate stage 5 and the second substrate P2 on the second substrate stage 5 have the same configuration. The second image field (projection field) AR2 on the second substrate P2 is set in a rectangular shape (in a slit form) with the X axis direction being a longitudinal direction. At the time of exposing the second substrate P2, the control unit 7 controls the second substrate stage 5 so that the shot fields S(S1 to S21) on the second substrate P2 pass through the second image field AR2 corresponding to the second exposure light EL, moving the second substrate P2 in the Y axis direction. By repeating the scan operation in the −Y direction and the scan operation in the +Y direction of the second substrate P2, the control unit 7 sequentially exposes the plurality of shot fields S1 to S21 on the second substrate P2.

Next is a description of the method of exposing the first substrate P1 and the second substrate P2 using the exposure apparatus EX having the above construction.

The control unit 7 loads the mask M onto the mask stage 2, and loads the first substrate P1 and first second substrate P2 onto the first substrate stage 4 and the second substrate stage 5, respectively. The control unit 7 then appropriately executes predetermined processing before starting exposure, for example, an operation for obtaining the position information of respective shot fields S on the first substrate P1 and the second substrate P2, an operation for obtaining the position information of an image surface formed in the first image field AR1 and the second image field AR2, and an operation for obtaining surface position information of the surfaces of the first substrate P1 and the second substrate P2 (including irregularity information), based on the detection result of the alignment mark AM.

In the present embodiment, the exposure apparatus EX concurrently performs exposure of the first substrate P1 and exposure of the second substrate P2. The control unit 7 sets moving conditions including positions, speed, and acceleration of the mask stage 2 (mask M), the first substrate stage 4 (first substrate P1), and the second substrate stage 5 (second substrate P2) during exposure, as the predetermined processing before starting the exposure, so that projection start and end timing of the image of the pattern PA formed in the first image field AR1 relative to the shot fields S on the first substrate P1, and projection start and end timing of the image of the pattern PA formed in the second image field AR2 relative to the shot fields S on the second substrate P2 are optimum.

After having executed the above described predetermined processing, the control unit 7 starts exposure of the first substrate P1 and the second substrate P2. The control unit 7 uses the illumination system IL to start the operation of irradiating the exposure light EL, respectively, to the first object field area FA1 and the second object field area FA2. The control unit 7 exposes the shot fields S on the first substrate P1 and the second substrate P2, while monitoring the position information of the first substrate stage 4 and the second substrate stage 5, and synchronously performing movement of the first substrate P1 in the Y axis direction relative to the first image field AR1, movement of the second substrate P2 in the Y axis direction relative to the second image field AR2, and movement of the mask in the Y axis direction relative to the first object field area FA1 and the second object field area FA2. In the present embodiment, for example, when the mask M is moved in the +Y direction, the first substrate P1 and the second substrate P2 are moved in the −Y direction, and when the mask M is moved in the −Y direction, the first substrate P1 and the second substrate P2 are moved in the +Y direction.

The image of the pattern PA positioned in the first object field area FA1 is formed based on the exposure light EL from the pattern PA positioned in the first object field area FA1. The shot fields S on the first substrate P1 are exposed with the image of the pattern PA formed in the first image field AR1. Moreover, the image of the pattern PA positioned in the second object field area FA2 is formed based on the exposure light EL from the pattern PA positioned in the second object field area FA2. The shot fields S on the second substrate P2 are exposed with the image of the pattern PA formed in the second image field AR2.

During exposure of the first substrate P1 and the second substrate P2, the control unit 7 controls the position in the Z axis, the $\theta X$, and the $\theta Y$ directions of the first substrate stage 4 and the second substrate stage 5, so that the image surface of the pattern PA formed in the first image field AR1 and the surface of the first substrate P1 (exposure surface) are in a desired positional relationship, and the image surface of the pattern PA formed in the second image field AR2 and the surface of the second substrate P2 (exposure surface) are in a desired positional relationship. Accordingly, the first substrate P1 and the second substrate P2 are exposed, while the positional relationship of the image surface of the pattern PA and the surfaces (exposure surfaces) of the first substrate P1 and the second substrate P2 are being adjusted.

As described above, in the present embodiment, the first substrate P1 and the second substrate P2 can be exposed simultaneously by using one mask M. Accordingly, the throughput can be improved, while suppressing cost, thereby enabling efficient exposure of a plurality of substrates. In the present embodiment, the shot fields S on the first substrate P1 and the second substrate P2 can be exposed simultaneously with one scanning operation.

Second Embodiment

Figure 4:
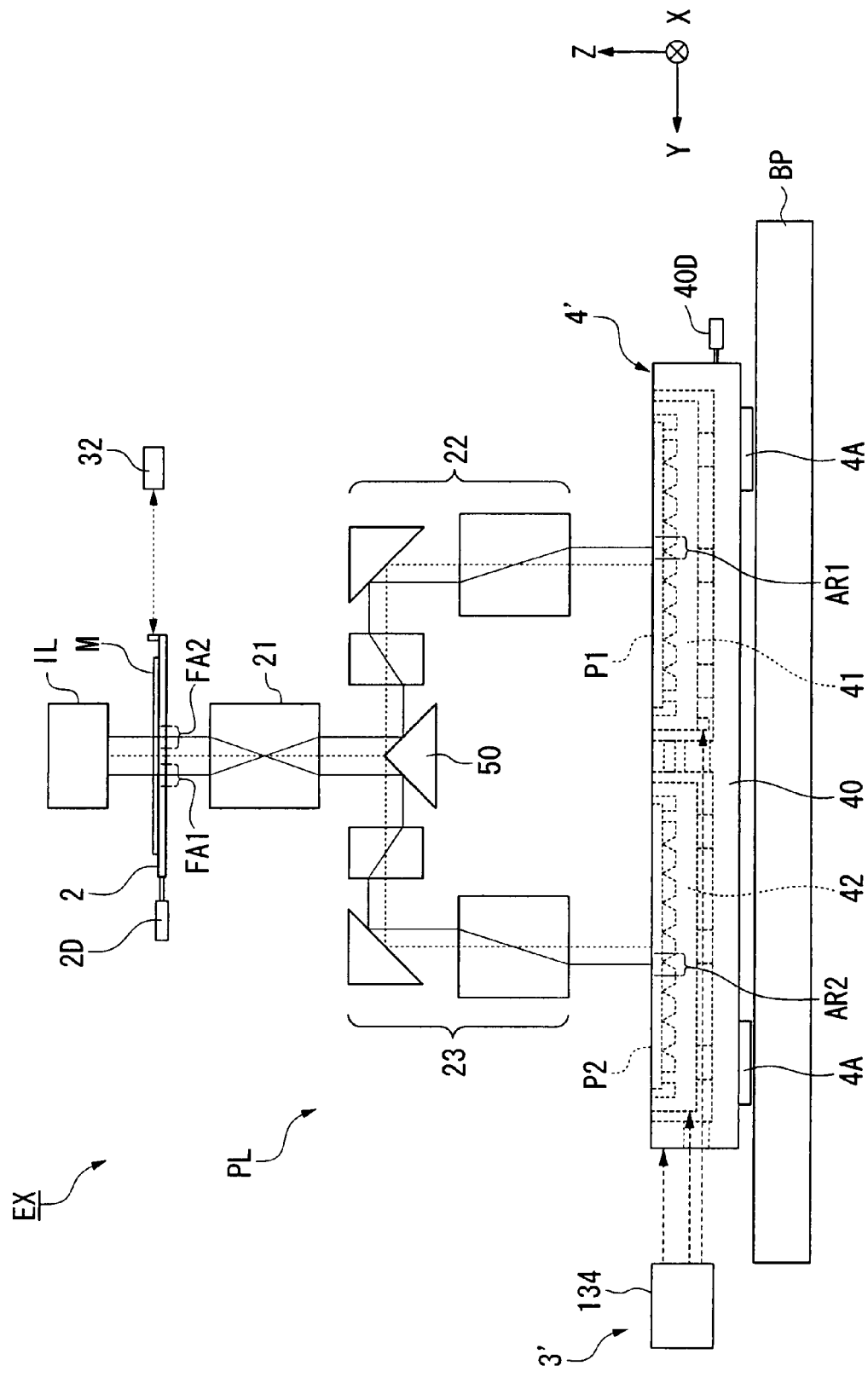
FIG. 4 is a schematic block diagram showing an exposure apparatus according to a second embodiment.
Figure 5:
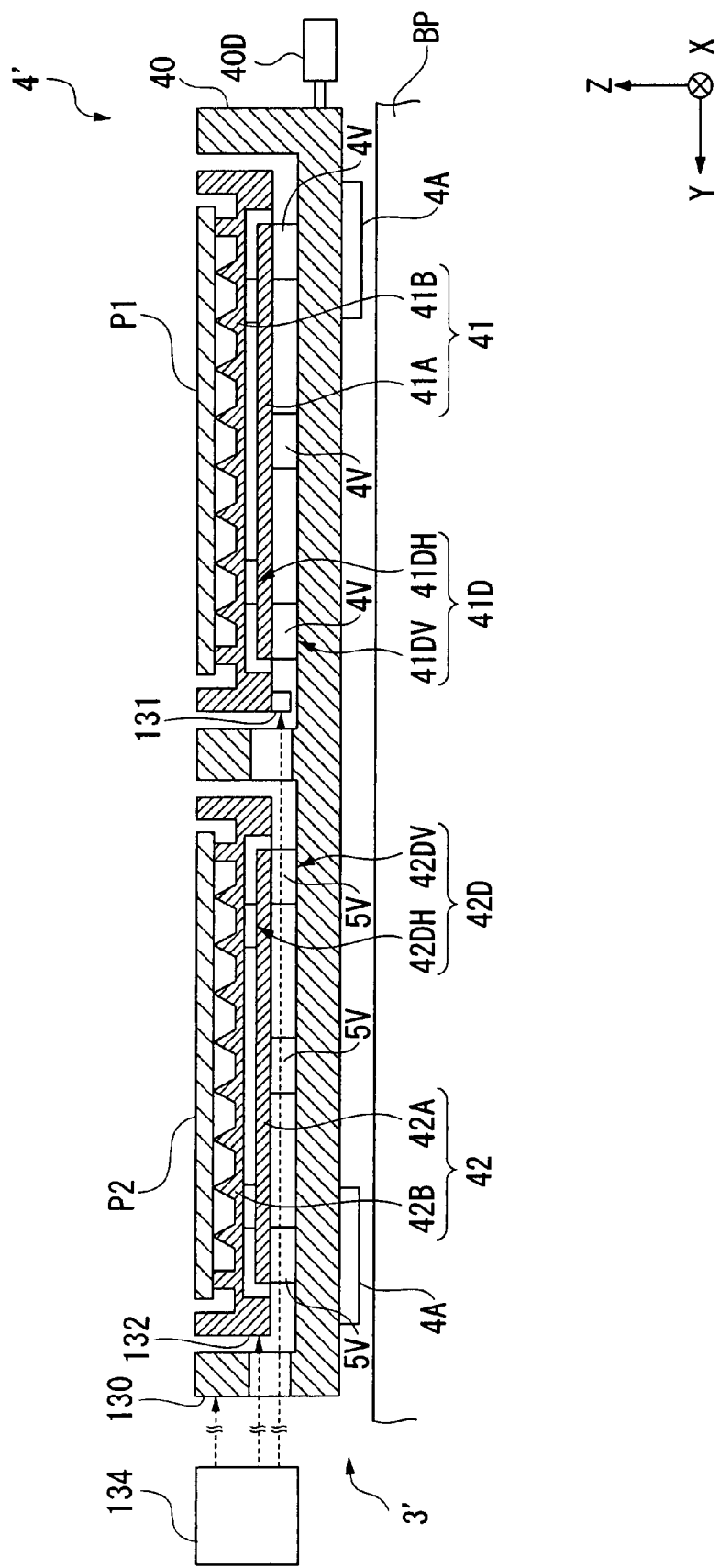
FIG. 5 is a cross-section showing a substrate stage according to the second embodiment.

Next is a description of a second embodiment with reference to FIG. 4 and FIG. 5. The characteristic part of this embodiment is the point that a substrate stage 4' has a main stage 40, a first substage 41, and a second substage 42. The main stage 40 is capable of holding a first substrate P1 and a second substrate P2 and moving in substantially the same scanning direction, on the light emitting side (image surface side) of the projection optical system PL. The first substage 41 is capable of moving the first substrate P1 with respect to the main stage 40. The second substage 42 is capable of moving the second substrate P2 with respect to the main stage 40. In the following description, components the same as or equivalent to those in the abovementioned embodiment are denoted by the same reference symbols, and their description is simplified or omitted.

FIG. 4 is a schematic diagram showing an exposure apparatus EX according to the present embodiment, and FIG. 5 is a sectional view showing the substrate stage 4' according to the present embodiment. The substrate stage 4' comprises a main stage 40, a first substage 41 capable of moving on the main stage 40 in a condition with the first substrate P1 held, and second substage 42 capable of moving on the main stage 40 in a condition with the second substrate P2 held.

The main stage 40 holds the first substrate P1 via the first substage 41, and holds the second substrate P2 via the second substage 42. The main stage 40 is capable holding the first substrate P1 and the second substrate P2 via the first substage 41 and the second substage 42, of moving in substantially the same scanning direction (Y axis direction) and in a direction orthogonal to the scanning direction (X axis direction). Furthermore the main stage 40 is also capable of moving in the $\theta Z$ direction.

The main stage 40 is supported without contact with respect to the upper surface (guide surface) of the base member BP, by air bearings 4A. The upper surface of the base member BP is substantially parallel with the XY plane. The main stage 40 is capable of moving on the base member BP along the XY plane. Furthermore, the exposure apparatus EX has a main stage drive device 40D including an actuator such as for example a linear motor, for moving the main stage 40 in the X axis, the Y axis and the $\theta Z$ direction. For example, by moving the main stage 40 in the Y axis direction, the first substage 41 and the second substage 42 on the main stage 40 also move in the Y axis direction together with the main stage 40. Consequently, by moving the main stage 40 in the Y axis direction, the first substrate P1 and the second substrate P2 held on the first substage 41 and the second substage 42 also move in the Y axis direction together with the main stage 40. Similarly, by moving the main stage 40 in the X axis direction, the first substage 41 and the second substage 42 on the main stage 40 also move in the X axis direction together with the main stage 40. Consequently, by moving the main stage 40 in the X axis direction, the first substrate P1 and the second substrate P2 held on the first substage 41 and the second substage 42 also move in the X axis direction together with the main stage 40.

The first substage 41 has a table 41A and a holder 41B mounted on the table 41A, that holds the first substrate P1. The table 41A is provided so as to be capable of moving in the Z axis, the $\theta X$ and the $\theta Y$ directions with respect to the main stage 40. The holder 41B is provided so as to be capable of moving in the X axis, the Y axis and the $\theta Z$ directions with respect to the table 41A. The substrate stage 4' comprises a first drive system 41DH provided between the table 41A and the holder 41B of the first substage 41, and including a plurality of actuators such as for example a voice coil motor, and a second drive system 41DV provided between the table 41A and the main stage 40 and including a plurality of actuators 4V such as for example a voice coil motor. By means of the first drive system 41DH, the holder 41B can be minutely moved in the X axis, the Y axis and the $\theta Z$ directions with respect to the table 41A, and by means of the second drive system 41DV, the table 41A can be minutely moved in the Z axis, the $\theta Z$ and the $\theta Y$ directions with respect to the main stage 40. The control unit 7 controls the second drive system 41DV, and adjusts the position of the table 41A in relation to the Z axis, the $\theta Z$ and the $\theta Y$ directions, and is thereby capable of adjusting the position of the first substrate P1 held on the holder 41B on the table 41A, in the Z axis, the $\theta X$, and the $\theta Y$ directions. Furthermore, the control unit 7 is capable of moving the holder 41B in the X axis, the Y axis and the $\theta Z$ directions with respect to the table 41A by driving the first drive system 41DH. The control unit 7 controls the first drive system 41DH, and adjusts the position of the holder 41B in relation to the X axis, the Y axis, and the $\theta Z$ directions, and is thereby capable of adjusting the position of the first substrate P1 held in the holder 41B, in the X axis, the Y axis, and the $\theta Z$ directions. In this manner, the control unit 7 is capable of adjusting the position of the first substrate P1 held in the holder 41B of the first substage 41, in relation to directions of 6 degrees of freedom of the X axis, the Y axis, the Z axis, the $\theta X$, the $\theta Y$, and the $\theta Z$ directions, by driving a first substage drive unit 41D which includes the first drive system 41DH and the second drive system 41DV.

Similarly to the first substage 41, the second substage 42 has a table 42A and a holder 42B mounted on the table 42A, that holds the second substrate P2. The table 42A is provided so as to be capable of moving in the Z axis, the $\theta X$ and the $\theta Y$ directions with respect to the main stage 40. The holder 42B is provided so as to be capable of moving in the X axis, the Y axis and the $\theta Z$ directions with respect to the table 42A. Moreover, a first drive system 42DH is provided between the table 42A and the holder 42B of the second substage 42, and a second drive system 42DV is provided between the table 42A and the main stage 40. By means of the first drive system 42DH, the holder 42B can be minutely moved in the X axis, the Y axis and the $\theta Z$ directions with respect to the table 42A, and by means of the second drive system 42DV, the table 42A can be minutely moved in the Z axis, the $\theta Z$ and the $\theta Y$ directions with respect to the main stage 40. The control unit 7 is capable of adjusting the position of the second substrate P2 held in the holder 42B of the second substage 42, in relation to directions of 6 degrees of freedom of the X axis, the Y axis, the Z axis, the $\theta X$, the $\theta Y$, and the $\theta Z$ directions, by driving a second substage drive unit 42D which includes the first drive system 42DH and the second drive system 42DV.

A measurement system 3' of the present embodiment is capable of respectively measuring the position information of the main stage 40, the first substage 41, and the second substage 42. The measurement system 3' includes; a reflecting surface 130 provided on the main stage 40, a reflecting surface 131 of a reflecting member provided on the first substage 41, a reflecting surface 132 provided on the second substage 42, and a laser interferometer 134 that projects measuring light onto the reflecting surfaces 130, 131, and 132 and receives the reflected light and acquires position information of each of the main stage 40, the first substage 41, and the second substage 42.

In FIG. 5, the laser interferometer 134 is positioned on the +Y side of the main stage 40, and is capable of irradiating a plurality of measuring lights with the Y axis direction as the measuring axis, onto the reflecting surface 130. The laser interferometer 134 is capable of acquiring the position information of the main stage 40 in relation to the Y axis direction and the $\theta Z$ direction, based on the reflection light of the measuring light irradiated onto the reflecting surface 130.

An aperture is formed at a predetermined position in the main stage 40. The laser interferometer 134 is capable of irradiating a plurality of measurement lights with the Y axis direction as the measuring axis, onto the reflecting surface 131 via this aperture, and is capable of irradiating measurement light with the Y axis direction as the measuring axis, onto the reflecting surface 132. The laser interferometer 134 is capable of acquiring position information of the first substage 41 (holder 41B) and the second substage 42 (holder 42B) in the Y axis direction and the $\theta Z$ direction, based on the reflection light of the measuring light irradiated onto to the reflecting surfaces 131 and 132.

While not shown in the figure, the measurement system 3' comprises a laser interferometer capable of irradiating a plurality of measurement lights with the X axis direction as the measuring axis, onto reflecting surfaces respectively provided at predetermined positions on the main stage 40, the first substage 41, and the second substage 42, and is capable of acquiring position information of the main stage 40, the first substage 41 (holder 41B), and the second substage 42 (holder 42B) in relation to the X axis direction.

Furthermore, the measurement system 3' can comprise a laser interferometer capable of irradiating a plurality of measurement lights with the Z axis direction as the measuring axis, onto reflecting surfaces respectively provided at predetermined positions on the main stage 40, the first substage 41, and the second substage 42. As a result it is capable of acquiring position information of the main stage 40, the first substage 41 (holder 41B), and the second substage 42 (holder 42B) in relation to the Z axis, and the θX and the θY directions.

The control unit 7 appropriately moves the main stage 40, the first substage 41, and the second substage 42, based on the measurement results of the measurement system 3', and performs position control of the first substrate P1 and the second substrate P2 held on the holder 41b and the holder 42b of the first substage 41 and the second substage 42. Furthermore, the control unit 7 moves at least one of the first substage 41 and the second substage 42 with respect to the main stage 40, and can thereby adjust the relative positional relationship between the first substrate P1 and the second substrate P2.

When the first substrate P1 and the second substrate P2 are exposed, each of the exposure lights EL for the first substrate P1 and the second substrate P2 are irradiated while moving the mask M in the scanning direction (the Y axis direction) using the mask stage 2, and while moving the first substrate P1 and the second substrate P2 in the scanning direction (the Y axis direction) using the main stage 40. The control unit 7 drives the first substage 41 and the second substage 42 while moving in the Y axis direction by means of the main stage 40, and is can expose the first substrate P1 and the second substrate P2 while adjusting the position and posture of the first substrate P1 and the second substrate P2.

In this manner, also by using the substrate stage 4' shown in FIGS. 4 and 5, the first substrate P1 and the second substrate P2 can be exposed at substantially the same time, and a plurality of substrates can be exposed with good efficiency.

Third Embodiment

Figure 6A:
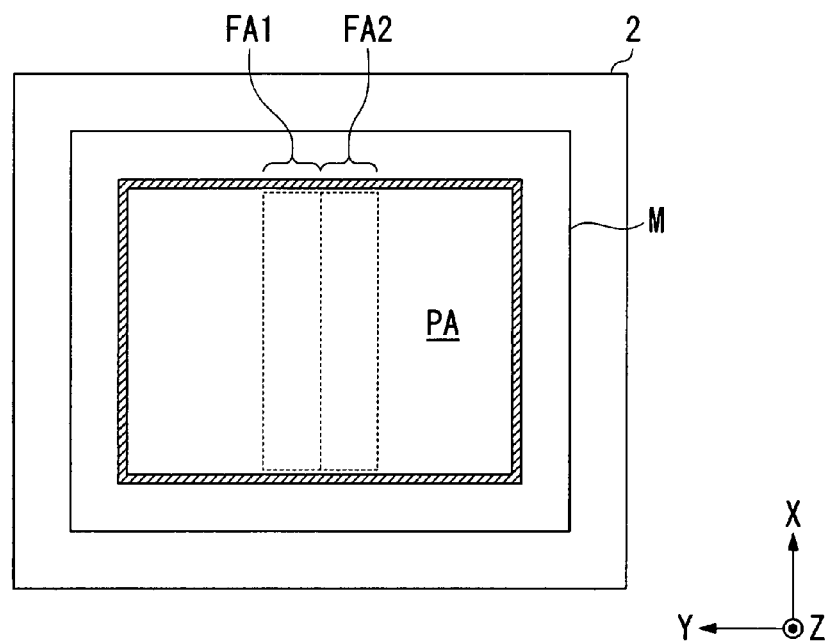
FIG. 6A shows a relationship between a mask and an object field area according to a third embodiment.
Figure 6B:
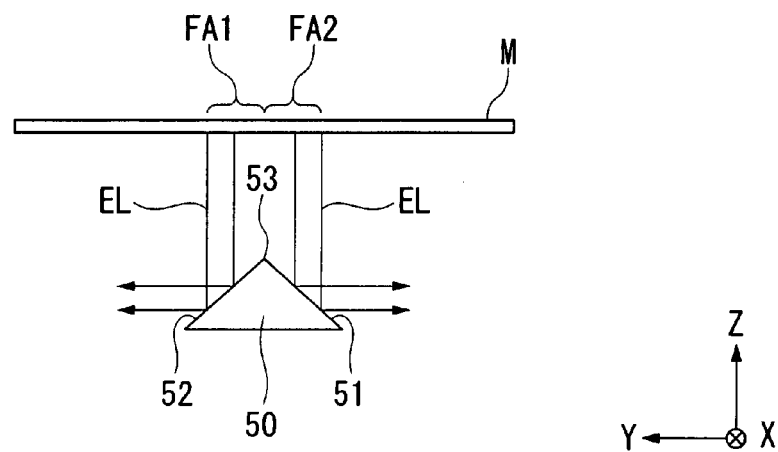
FIG. 6B shows the relationship between the mask and the object field area according to the third embodiment.

Next is a description of a present embodiment with reference to FIG. 6A and FIG. 6B. In the above embodiments, the illumination system IL divides the exposure light EL emitted from the light source device 1 into two exposure lights EL, and irradiates the divided exposure lights EL respectively onto the first object field area FA1 and the second object field area FA2. A characteristic point of this embodiment is that the exposure light EL is not divided, but the exposure light EL is irradiated onto both the first object field area FA1 and the second object field area FA2.

FIG. 6A is a plan view showing the mask M held on the mask stage 2 according to the present embodiment, and FIG. 6B is a diagram showing a state in which the exposure light EL having passed through the mask M is irradiated onto the optical member 50.

As shown in FIG. 6A, in the present embodiment, the illumination system IL does not divide the exposure light EL, but irradiates the exposure light EL onto the first object field area FA1 and the second object field area FA2 of the projection optical system PL. In the embodiment, the first object field area FA1 and the second object field area FA2 of the projection optical system PL are set so as to be aligned in the Y axis direction, and an edge on the −Y side of the first object field area FA1 and an edge on the +Y side of the first object field area FA2 are brought into contact with each other (or adjacent to each other).

The exposure light EL irradiated onto the first object field area FA1 and the second object field area FA2 is divided into the exposure light EL to be irradiated onto the first reflecting surface 51 and the exposure light EL to be irradiated onto the second reflecting surface 52, as shown in the diagram of FIG. 6B, with the line segment (apex) 53 of the optical member 50 being a boundary. The exposure light EL irradiated onto the first reflecting surface 51 is guided to the first image field AR1, and the exposure light EL irradiated onto the second reflecting surface 52 is guided to the second image field AR2.

Thus, the exposure light EL can be irradiated onto both the first object field area FA1 and the second object field area FA2 without being divided by the illumination system IL, and divided by the optical member 50 in the projection optical system PL. In the present embodiment, even when the exposure light EL is not divided by the illumination system IL, and the first object field area FA1 and the second object field area FA2 in contact with each other (or adjacent to each other) are formed, the exposure light EL from the first image field FA1 can be guided to the first image field AR1, and the exposure light EL from the second image field FA2 can be guided to the second image field AR2, using the apex 53 as a boundary.

Fourth Embodiment

Figure 7A:
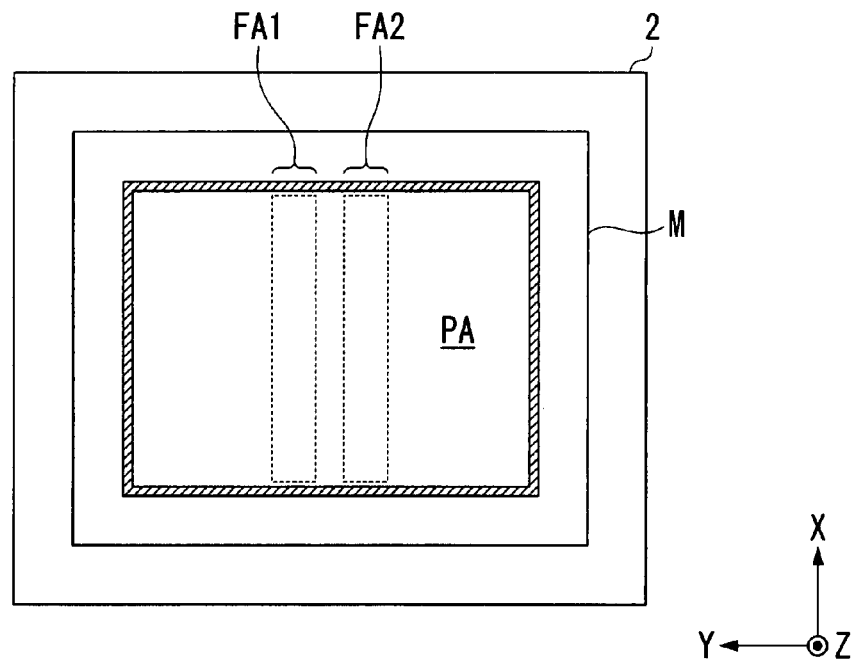
FIG. 7A shows a relationship between a mask and an object field area according to a fourth embodiment.
Figure 7B:
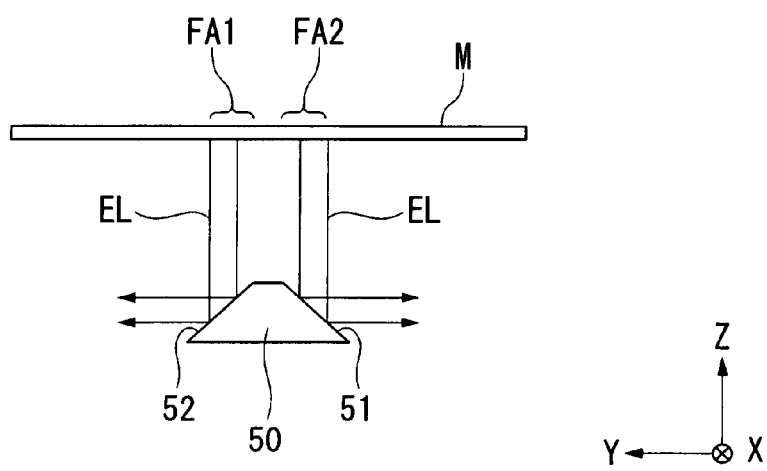
FIG. 7B shows the relationship between the mask and the object field area according to the fourth embodiment.

Next is a description of a fourth embodiment with reference to FIG. 7A and FIG. 7B. In the above embodiments, the apex 53 of the optical member 50 is in a V-shape, however, as shown in FIG. 7B, the cross-section parallel to the YZ plane of the optical member 50 can be formed in a trapezoidal shape. Accordingly, as shown in FIG. 7A, even when the exposure light EL is not divided by the illumination system IL and is allowed to enter into the first object field area FA1 and the second object field area FA2, the exposure light EL from the first image field FA1 can be guided to the first image field AR1, and the exposure light EL from the second image field FA2 can be guided to the second image field AR2.

Fifth Embodiment

Figure 8:
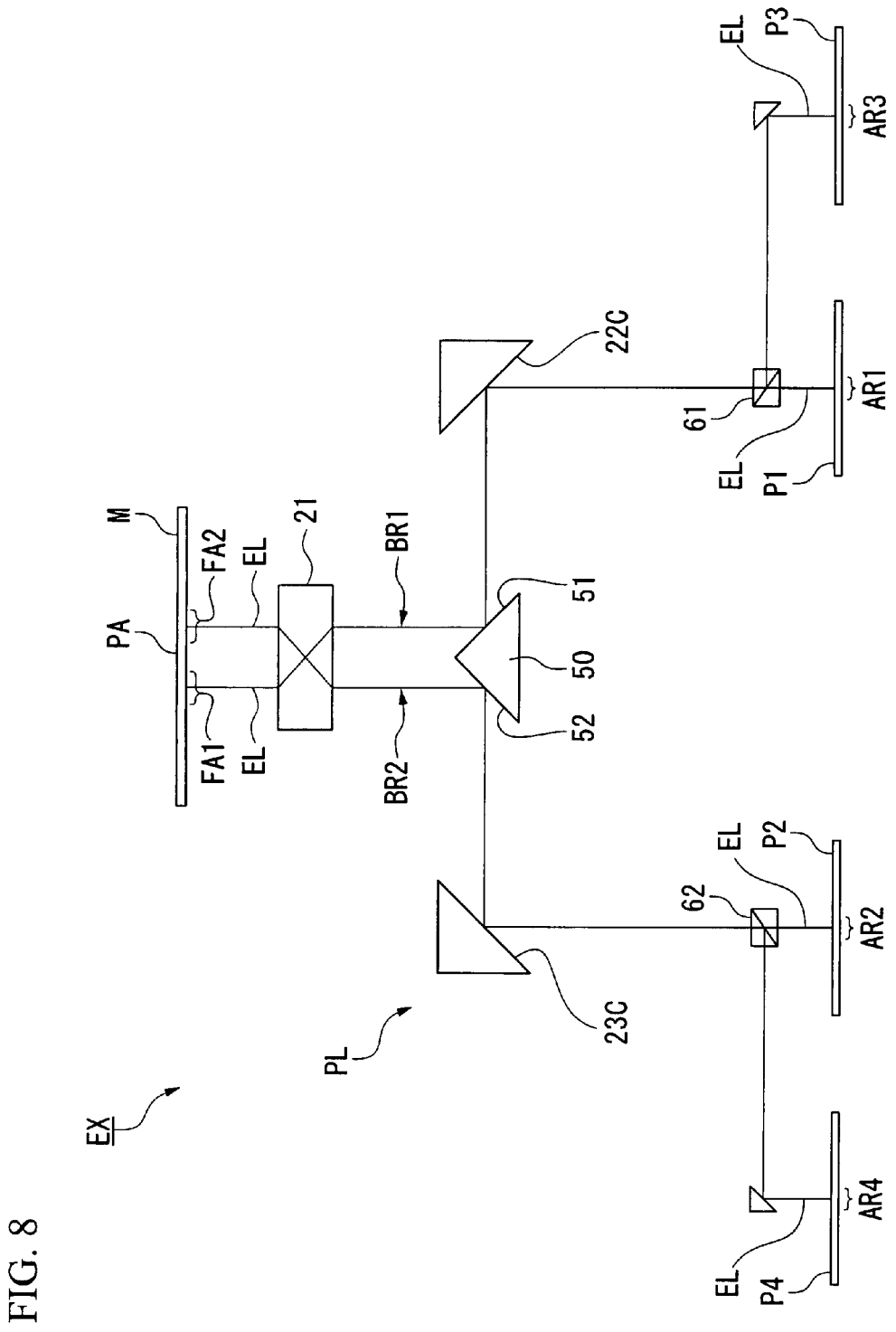
FIG. 8 is a schematic block diagram showing an exposure apparatus according to a fifth embodiment.

Next is a description of a fifth embodiment with reference to FIG. 8. A characteristic point of this embodiment is that the projection optical system PL forms the image of the pattern PA in a third image field AR3 different from the first image field AR1, based on the exposure light EL from the pattern PA positioned in the first object field area FA1.

FIG. 8 is a diagram showing the exposure apparatus EX according to the fifth embodiment. As shown in FIG. 8, a branching optical element (beam splitter) 61 that branches the exposure light EL from the first object field area FA1 is arranged at a predetermined position on a first optical path BR1 along which the exposure light EL from the first object field area FA1 travels. The exposure light EL traveling on the first optical path BR1 from the first object field area FA1 passes via the first reflecting surface 51, and is branched by the branching optical element 61 to be guided to a first image field AR1 and a third image field AR3. In the projection optical system PL, the image of the pattern PA can be formed in the first image field AR1 and the third image field AR3 based on the exposure light EL from the pattern PA positioned in the first object field area FA1, by branching the exposure light EL from the first object field area FA1 by the branching optical element 61.

Moreover, in the present embodiment, a branching optical element (beam splitter) 62 that branches the exposure light EL from the second object field area FA2 is also arranged at a predetermined position on a second optical path BR2 along which the exposure light EL from the second object field area FA2 travels. The exposure light EL traveling on the second optical path BR2 from the second object field area FA2 passes via the second reflecting surface 52, and is branched by the branching optical element 62 to be guided to a second image field AR2 and a fourth image field AR4 different from the second image field AR2. In the projection optical system PL, the image of the pattern PA can be formed in the second image field AR2 and the fourth image field AR4 based on the exposure light EL from the pattern PA positioned in the second object field area FA2, by branching the exposure light EL from the second object field area FA2 by the branching optical element 62.

The exposure apparatus EX in the present embodiment can expose the third substrate P3, which is different from the first substrate P1 and second substrate P2, with the image of the pattern PA formed in the third image field AR3. Likewise, the exposure apparatus EX can expose the fourth substrate P4, which is different from the first, second, and third substrates P1, P2, and P3, with the image of the pattern PA formed in the fourth image field AR4.

Sixth Embodiment

Figure 9:
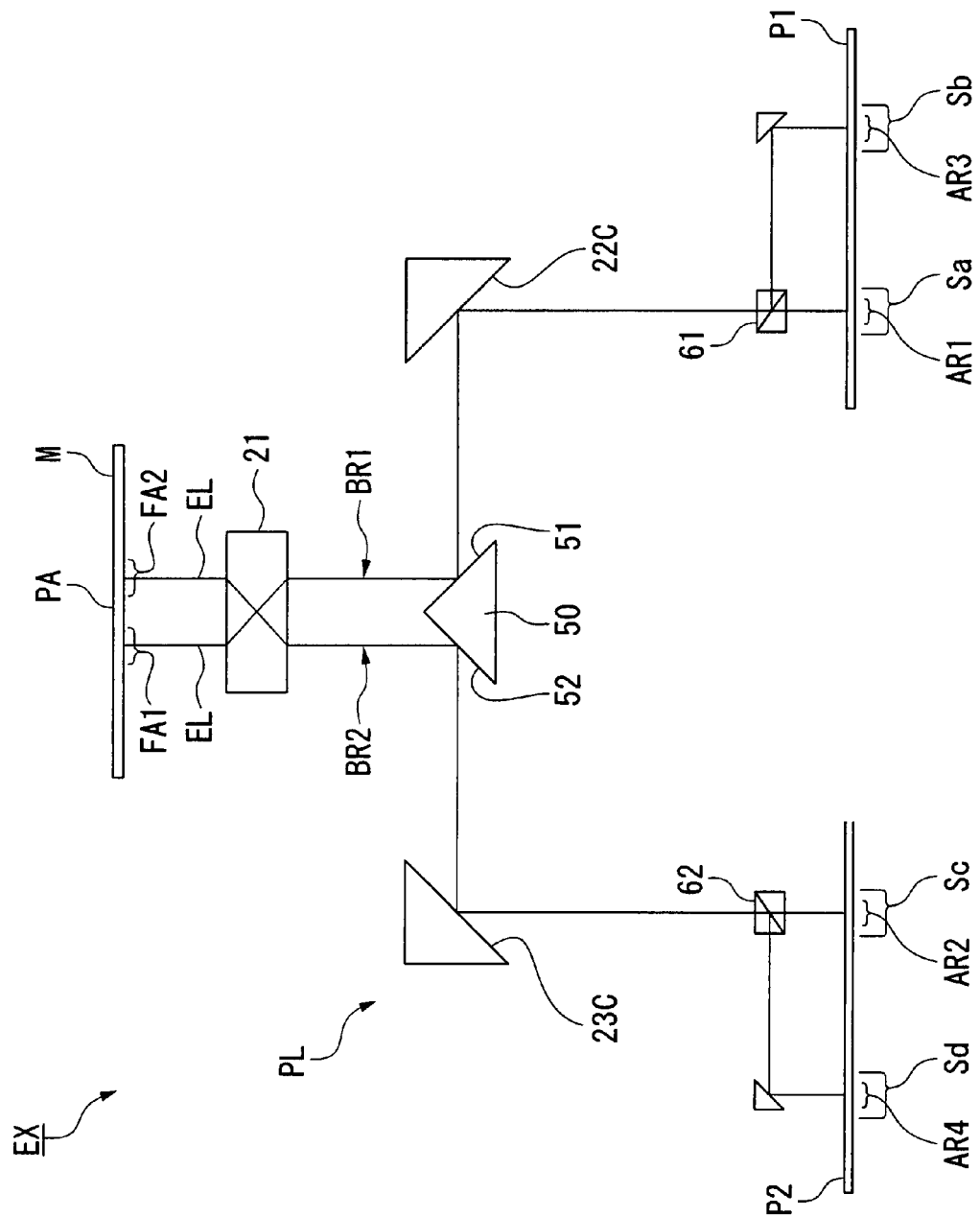
FIG. 9 is a schematic block diagram showing an exposure apparatus according to a sixth embodiment.

Next is a description of a sixth embodiment with reference to FIG. 9. As shown in the diagram of FIG. 9, the exposure apparatus EX can simultaneously expose a first shot field Sa and a second shot field Sb separate from the first shot field Sa on the first substrate P1 with the image of the pattern PA formed respectively in the first image field AR1 and the third image field AR3 by the projection optical system PL. That is, the exposure apparatus EX can simultaneously expose each of the shot fields, which do not overlap on each other, on one substrate with the image of the pattern PA formed respectively in the first image field AR1 and the third image field AR3 by the projection optical system PL. Moreover, the exposure apparatus EX can expose a shot field Sc on the second substrate P2 with the image of the pattern PA formed in the second image field AR2, concurrently with the operation of exposing a plurality of (two) shot fields on the first substrate P1 simultaneously. Furthermore, the exposure apparatus EX can expose shot fields Sc and Sd on the second substrate P2 with the image of the pattern PA formed in the second image field AR2 and the fourth image field AR4, concurrently with the operation of exposing a plurality of shot fields on the first substrate P1 with the image of the pattern PA formed in the first image field AR1 and the third image field AR3 simultaneously.

In the fifth and sixth embodiments, one branching optical element 61 is arranged on the first optical path BR1, to branch the exposure light EL from the first object field area FA1, however, another branching optical element can be provided on at least one of the optical paths of the branched exposure light EL to branch the exposure light EL. Likewise, a plurality of branching optical elements can be provided on the second optical path BR2 to branch the exposure light EL. In this manner, by using the plurality of branching optical elements to branch the exposure light EL, the number of image fields can be made different from that of the object field areas (increased relative to the object field areas).

In the first to the sixth embodiments, the projection optical system PL can be; a refractive system which does not include a reflecting optical element, a reflecting system which does not include a refractive optical element, or a cata-dioptric system which includes both a reflecting optical element and a refractive optical element.

In the abovementioned respective embodiments, an immersion system such as disclosed for example in PCT International Patent Publication No. WO 1999/49504 can be applied. For example, a liquid immersion region can be formed on the first substrate P1 and the second substrate P2 so as to cover the first image field AR1 and the second image field AR2, and the exposure light EL can be irradiated onto the first substrate P1 and the second substrate P2 via the liquid. As the liquid, water (pure water) can be used. Other than water, for example a fluorocarbon fluid such as a perfluoropolyether (PFPE) or a fluorocarbon oil, or a cedar oil or the like can be used. Moreover as the liquid, a liquid with a refractive index that is higher than that of water with respect to the exposure light (for example a liquid with a refractive index of approximately 1.6 to 1.8) can be used. Furthermore, a front optical element FL can be formed from a material with a refractive index that is higher than that of quartz or fluorite (for example 1.6 or more). Here, examples of the liquid LQ with a refractive index that is higher than that of pure water (for example 1.5 or more) include for example: a predetermined liquid with isopropanol with a refractive index of approximately 1.5, and glycerol (glycerine) with a refractive index of approximately 1.61, having a C—H bond or an O—H bond; a predetermined liquid (organic solvent) such as hexane, heptane, decane; and decalin (decahydronaphthalene) with a refractive index of approximately 1.6. Moreover, this liquid LQ can be one where two or more types of optional liquids of the predetermined liquids are mixed, or one where at least one of the predetermined liquids is added to (mixed with) pure water. Furthermore, the liquid LQ can be one in which an acid or a base such as $H^+$, $Cs^+$, and $K^+$, or $Cl^-$, $SO_4^{2-}$, and $PO_4^{2-}$ is added to (mixed with) pure water, or one in which fine particles of for example Al oxide are added to (mixed with) pure water. The liquid is preferably one for which the light absorption coefficient is small, the temperature dependency is small, and which is stable with respect to the photosensitive material (or top coat film or anti-reflection film) coated on the surface of the projection optical system and/or the substrate. As the liquid, a supercritical fluid can be used. A top coat film that protects the photosensitive material and the base member from the liquid can be provided on the substrate. Moreover, the front optical element can be formed from a monocrystal material, for example, quartz (silica) or a fluoride compound such as calcium fluoride, barium fluoride, strontium fluoride, lithium fluoride, and sodium fluoride, or a material with a refractive index higher than quartz and fluorite (for example, 1.6 or more). As the material with a refractive index equal to or higher than 1.6, for example, sapphire and germanium dioxide disclosed in PCT International Patent Publication No. WO 2005/059617, or potassium chloride (with a refractive index of approximately 1.75) disclosed in PCT International Patent Publication No. WO 2005/059618 can be used.

When the liquid immersion system is used, for example, as disclosed in PCT International Patent Publication No. WO 2004/019128 (corresponding to U.S. Patent Application, Publication No. 2005/0248856), the optical path on an object surface side as well as the optical path on an image surface side of the front optical element can be filled with the liquid. Moreover, a thin film having lyophilic and/or a dissolution-preventing function can be formed partially (at least including a contact surface with the liquid) or wholly on the surface of the front optical element. Quartz has high compatibility with the liquid, and the dissolution-preventing film is not required. However, it is desirable to form at least the dissolution-preventing film on fluorite.

The above respective embodiments, are ones which measure the position information of the mask stage and the substrate stage using an interferometer system as the measurement system 3. However the invention is not limited to this, and for example an encoder system that detects a scale (grating) provided for example on the top surface of the substrate stage can be used. In this case, as a hybrid system which uses both the interferometer system and the encoder system, preferably the measurement results of the interferometer system are used to perform calibration on the detection results of the encoder system. Furthermore, the interferometer system and the encoder system can be alternately used, or both can be used, to perform position control of the substrate stage.

As the substrate in the abovementioned respective embodiments, not only a semiconductor wafer for manufacturing a semiconductor device, but also a glass substrate for a display device, a ceramic wafer for a thin film magnetic head, or a mask or an original plate of a reticle (synthetic quartz or silicon wafer) used in an exposure apparatus, or a film member and the like can be used. Furthermore, the shape of the substrate is not limited to a circle, and can be another shape such as a rectangle.

Moreover, the exposure apparatus of the abovementioned respective embodiments can be provided with a measurement stage which is movable independently of the substrate stage which holds a substrate, and on which is mounted a measurement member (for example a reference member formed with a reference mark, and/or various types of photoelectronic sensors), as disclosed for example in Japanese Unexamined Patent Application, First Publication No. H11-135400 (corresponding to PCT International Patent Publication No. WO 1999/23692) and Japanese Unexamined Patent Application, First Publication No. 2000-164504 (corresponding to U.S. Pat. No. 6,897,963).

In the abovementioned respective embodiments, the mask is used for forming the pattern, however instead of this, an electronic mask (referred to as a variable forming mask, active mask, or pattern generator) for forming a variable pattern can be used. As the electronic mask, for example, a deformable micro-mirror device or digital micro-mirror device (DMD), which is one type of nonluminescent image display device (also referred to as a spatial light modulator (SLM)), can be used. The DMD has a plurality of reflecting elements (minute mirrors) driven based on predetermined electronic data. The plurality of reflecting elements are arranged in a two-dimensional matrix on the surface of the DMD, and driven in element units to reflect and deflect the exposure light. Angles of the reflecting surfaces of the respective reflecting elements are adjusted. The operation of the DMD can be controlled by a control unit. The control unit drives the reflecting elements of the DMD based on the electronic data (pattern information) corresponding to the pattern to be formed on the substrate, to pattern the exposure light irradiated by the illumination system with the reflecting elements. By using the DMD, a replacement operation of the mask and a registration operation on the mask stage are not required at the time of pattern change, as compared to a case in which exposure is performed using a mask (reticle) including a pattern formed thereon. In the exposure apparatus that uses an electronic mask, the mask stage need not be provided, and the substrate can be moved in the X axis and Y axis directions by just the substrate stage. The exposure apparatus using the DMD is disclosed in, for example, Japanese Unexamined Patent Application, First Publication Nos. H08-313842 and 2004-304135, and U.S. Pat. No. 6,778,257.

The types of exposure apparatuses EX are not limited to exposure apparatuses for semiconductor device manufacture that expose a semiconductor device pattern onto a substrate P, but are also widely applicable to exposure apparatuses for the manufacture of liquid crystal display devices and for the manufacture of displays, and exposure apparatuses for the manufacture of thin film magnetic heads, image pickup devices (CCDs), micro machines, MEMS, DNA chips, and reticles or masks.

As far as is permitted, the disclosures in all of the Japanese Patent Publications and U.S. patents related to exposure apparatuses and the like cited in the above respective embodiments and modified examples, are incorporated herein by reference.

As described above, the exposure apparatus EX of the aforementioned embodiments is manufactured by assembling various subsystems, including the respective constituent elements, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection, the wiring and connection of electrical circuits, and the piping and connection of the atmospheric pressure circuit of the various subsystems. Of course, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 10:
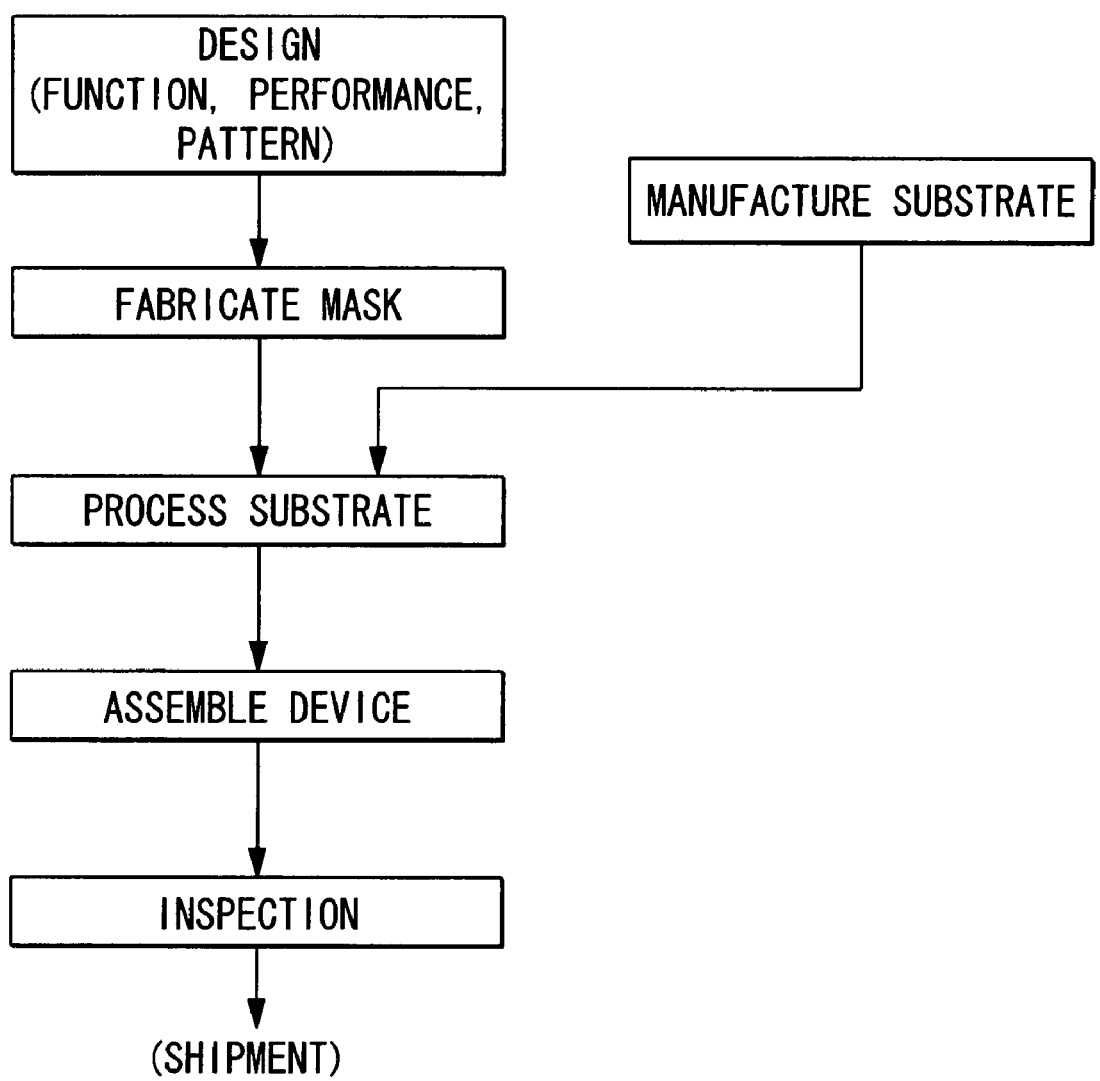
FIG. 10 is a flow chart that depicts one example of a process for fabricating a microdevice.

As shown in FIG. 10, microdevices such as semiconductor devices are manufactured by going through; a step 201 that performs microdevice function and performance design, a step 202 that fabricates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing) and etching the developed substrate, a device assembly step (including treatment processes such as a dicing process, a bonding process and a packaging process) 205, and an inspection step 206, and so on.

According to the present invention, the throughput can be improved while suppressing cost, and the substrate can be efficiently exposed. Consequently, a device can be manufactured with good productivity.

What is claimed is:

1. An exposure apparatus that exposes a substrate, comprising:
   a projection optical system that has a first object field area and a second object field area different from the first object field area and that projects an image of a pattern from a single mask onto a first image field and a second image field, the first object field area and the second object field area corresponding to separate locations on the single mask, an image of the pattern being formed from the single mask in the first image field by exposure light via the first object field area, and an image of the pattern being formed from the single mask in the second image field by exposure light via the second object field area, wherein a first substrate is exposed with the image of the pattern formed in the first image field, and a second substrate is exposed with the image of the pattern formed in the second image field.

2. An exposure apparatus according to claim 1, further comprising an illumination system that illuminates the first object field area and the second object field area with the exposure light.

3. An exposure apparatus according to claim 2, wherein the illumination system has a single light source, the first object field area and the second object field area are illuminated with the exposure light from the single light source.

4. An exposure apparatus according to claim 1, wherein
the projection optical system has a first reflecting surface arranged on a first optical path, being an optical path of the exposure light from the first object field area, and a second reflecting surface arranged on a second optical path, being an optical path of the exposure light from the second object field area, and wherein
the exposure light traveling on the first optical path is guided to the first image field via the first reflecting surface, and the exposure light traveling on the second optical path is guided to the second image field via the second reflecting surface.

5. An exposure apparatus according to claim 4, wherein
the first reflecting surface and the second reflecting surface are arranged at a position optically conjugate with the first object field area and the second object field area or in the vicinity thereof.

6. An exposure apparatus according to claim 4, wherein
the projection optical system includes:
a first optical element group that guides the exposure light from the pattern to the first reflecting surface and the second reflecting surface;
a second optical element group that guides the exposure light reflected by the first reflecting surface to the first image field; and
a third optical element group that guides the exposure light reflected by the second reflecting surface to the second image field.

7. An exposure apparatus according to claim 1, wherein
a predetermined area on the first substrate is exposed while the predetermined area of the first substrate moves in a predetermined scanning direction with respect to the first image field, and
a predetermined area on the second substrate is exposed while the predetermined area of the second substrate moves in a predetermined scanning direction with respect to the second image field.

8. An exposure apparatus according to claim 7, further comprising a substrate moving system that moves the first substrate in a predetermined scanning direction, and moves the second substrate in a predetermined scanning direction.

9. An exposure apparatus according to claim 8, wherein the substrate moving system includes:

a first substrate stage that holds and moves the first substrate, at adjacent a light emitting side of the projection optical system; and
a second substrate stage that holds the second substrate and moves independently of the first substrate stage.

10. An exposure apparatus according to claim 8, wherein, the substrate moving system includes:
a main stage that holds the first substrate and the second substrate, and moves the first substrate and the second substrate in substantially the same scanning direction, at adjacent a light emitting side of the projection optical system;
a first moving device that moves the first substrate with respect to the main stage; and
a second moving device that moves the second substrate with respect to the main stage.

11. An exposure apparatus according to claim 1, further comprising a measurement system that measures position information for each of the first substrate and the second substrate.

12. An exposure apparatus according to claim 1, wherein the first object field area and the second object field area are separated in a predetermined direction.

13. An exposure apparatus according to claim 1, wherein
the first substrate and the second substrate are exposed while the pattern moves in a predetermined scanning direction with respect to the first object field area and the second object field area.

14. An exposure apparatus according to claim 1, wherein the exposure of the first substrate is executed concurrently with at least a part of the exposure of the second substrate.

15. An exposure apparatus according to claim 1, wherein the projection optical system forms an image of the pattern in a third image field, based on the exposure light from the pattern positioned within the first object field area.

16. An exposure apparatus according to claim 15, wherein a third substrate is exposed with an image of the pattern formed in the third image field.

17. An exposure apparatus according to claim 15, wherein the projection optical system forms an image of the pattern in a fourth image field, based on the exposure light from the pattern positioned within the second object field area.

18. A device manufacturing method that uses an exposure apparatus according to claim 1.

19. An exposure apparatus according to claim 2, wherein the illumination system illuminates the first object field area with a first beam of the exposure light, and illuminates the second object field with a second beam of the exposure light, the first and second beam being separate beams.

20. An exposure apparatus according to claim 1, wherein the separate locations on the single mask are separated from each other by an area that does not receive the exposure light.

21. An exposure apparatus according to claim 1, wherein the first object field area and the second object field area are located apart from each other on the single mask.

22. An exposure apparatus according to claim 1, wherein the first object field area and the second object field area are located directly adjacent to each other on the single mask.

* * * * *